United States Patent
Chen (10) Patent No.: US 10,297,637 B2
(45) Date of Patent: May 21, 2019

(54) MICRO LIGHT-EMITTING DIODE ARRAY SUBSTRATE ENCAPSULATION STRUCTURE AND ENCAPSULATION METHOD THEREOF

(71) Applicant: Shenzhen China Star Optoelectronics Technology Co., Ltd., Shenzhen (CN)

(72) Inventor: Lixuan Chen, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 1 day.

(21) Appl. No.: 15/548,101

(22) PCT Filed: Jun. 20, 2017

(86) PCT No.: PCT/CN2017/089083
§ 371 (c)(1),
(2) Date: Aug. 2, 2017

(87) PCT Pub. No.: WO2018/214192
PCT Pub. Date: Nov. 29, 2018

(65) Prior Publication Data
US 2018/0342555 A1    Nov. 29, 2018

(30) Foreign Application Priority Data

May 23, 2017 (CN) .......................... 2017 1 0370047

(51) Int. Cl.
*H01L 21/00* (2006.01)
*H01L 27/15* (2006.01)
(Continued)

(52) U.S. Cl.
CPC ........ *H01L 27/153* (2013.01); *H01L 25/0753* (2013.01); *H01L 27/3244* (2013.01);
(Continued)

(58) Field of Classification Search
CPC ... H01L 27/153; H01L 33/42; H01L 25/0753; H01L 33/486; H01L 27/3244; H01L 33/54; H01L 51/56
See application file for complete search history.

(56) References Cited

U.S. PATENT DOCUMENTS

2006/0114678 A1    6/2006  Shimonishi et al.
2008/0191227 A1*   8/2008  Kimura .................. H01L 33/62
                                                             257/98
(Continued)

FOREIGN PATENT DOCUMENTS

CN          103035825 A      4/2013
CN          105990492 A     10/2016
WO       WO2013135053 A1    9/2013

*Primary Examiner* — Charles D Garber
*Assistant Examiner* — Abdulfattah B Mustapha
(74) *Attorney, Agent, or Firm* — Leong C. Lei (57) ABSTRACT

The present invention provides a micro LED array substrate encapsulation structure and an encapsulation method thereof. The micro LED array substrate encapsulation structure of the present invention includes a base plate, a micro LED array, and a photoresist protection layer. The micro LED array includes a plurality of micro LEDs arranged in an array. The photoresist protection layer is formed with a plurality of vias at locations corresponding to the plurality of micro LEDs. The plurality of micro LEDs are respectively located in the plurality of vias. Each of the vias is filled therein with a UV resin microlens that has an upper surface in a bulging form and covers the micro LED in the corresponding one of the vias. The micro LEDs and driving substrates located thereunder can be protected and an effect of light emission of the micro LED array substrate can be improved.

13 Claims, 4 Drawing Sheets (51) Int. Cl.
*H01L 25/075* (2006.01)
*H01L 27/32* (2006.01)
*H01L 33/42* (2010.01)
*H01L 33/48* (2010.01)
*H01L 33/54* (2010.01)
*H01L 51/56* (2006.01)

(52) U.S. Cl.
CPC ............ *H01L 33/42* (2013.01); *H01L 33/486* (2013.01); *H01L 33/54* (2013.01); *H01L 51/56* (2013.01)

(56) References Cited

U.S. PATENT DOCUMENTS

| 2010/0155760 | A1 | 6/2010 | Lee |
| 2012/0302003 | A1* | 11/2012 | Shieh ................ H01L 29/7869 438/104 |
| 2013/0087822 | A1* | 4/2013 | Kim ..................... H01L 33/54 257/98 |
| 2015/0228631 | A1 | 8/2015 | Ray et al. |

* cited by examiner

MICRO LIGHT-EMITTING DIODE ARRAY SUBSTRATE ENCAPSULATION STRUCTURE AND ENCAPSULATION METHOD THEREOF

BACKGROUND OF THE INVENTION

1. Field of the Invention

The present invention relates to the field of display technology, and more particular to a micro light-emitting diode (LED) array substrate encapsulation structure and an encapsulation method thereof.

2. The Related Arts

A micro light-emitting diode (LED) is a device having a size between several microns and hundreds of microns. Since it is much smaller than regular LEDs in size, it becomes possible to use a single LED to serve as a pixel for displaying purposes. A micro LED display is a display device that displays an image with a display pixel array that is made up of a high-density arrangement of micro LED array, which, similar to a large scale outdoor LED display panel, allows each of the pixels to be addressable and individually drivable for light emission and can be considered as a miniature version of the outdoor LED display panel, wherein pixel distance is reduced from the order of millimeters to the order of microns. The micro LED display, similar to an organic light-emitting diode (OLED) display, is a self-luminous display, but compared to the OLED display, the micro LED display shows advantages, such as better material stability, extended life span, and being free of burn-in, and is considered the most powerful competitor of the OLED display.

In consideration of lattice match, the micro LED device must be first grown, through molecular beam epitaxy, on a sapphire type supply substrate, and followed by application of laser lift-off (LLO) technology to separate a micro LED bare chip from the supply substrate to be subsequently transferred, through micro transfer print (NTP), to a receiving substrate that is formed, in advance, with a circuit pattern, to form a micro LED array, which can be used to make a micro LED display panel. The basic principle of NTP is generally as follows. A transfer head that comprises a pattern, such as a polydimethylsiloxane (PDMS) transfer head having an embossed structure, is used to pick up, through suction, the micro LED bare chip from the supply substrate by means of a PDMS transfer layer that is adhesive, and then, the PDMS transfer head and the receiving substrate are aligned with each other, followed by having the micro LED bare chip that is picked and held by the PDMS transfer head attached to a predetermined location on the receiving substrate and then having the PDMS transfer head separated from the receiving substrate to complete the transfer of the micro LED bare chip and form a micro LED array substrate. Further, the receiving substrate is a silicon substrate that has been subject to formation of the circuit pattern thereon in advance and may be a flexible one or a rigid one.

In the known processes for manufacturing micro LED display panels, to provide protection to micro LEDs and a drive substrate located thereunder and also for improving an effect of light emission of the micro LED array, it is desired to provide a novel micro LED array substrate encapsulation structure and an encapsulation method thereof, this being one of the technical issues that have been long desired to solve.

SUMMARY OF THE INVENTION

An objective of the present invention is to provide a micro light-emitting diode (LED) array substrate encapsulation structure, which helps protect micro LEDs and drive substrates located thereunder and also improves an effect of light emission of the micro LED array substrate.

Another objective of the present invention is to provide a micro LED array substrate encapsulation method, which helps protect micro LEDs and drive substrates located thereunder and also improves an effect of light emission of the micro LED array substrate.

To achieve the above objectives, the present invention provides a micro LED array substrate encapsulation structure, which comprises a base plate, a micro LED array arranged on the base plate, and a photoresist protection layer arranged on the base plate;

wherein the micro LED array comprises a plurality of micro LEDs arranged in an array; and the photoresist protection layer is provided, at locations corresponding to the plurality of micro LEDs, with a plurality of vias formed therein and arranged in an array, the plurality of micro LEDs being respectively received in the plurality of vias; and each of the vias is filled therein with an ultraviolet (UV) resin microlens that has an upper surface made in a bulged form; each of the UV resin microlenses covers the micro LED received in a corresponding one of the vias.

A material of the photoresist protection layer and a material of the UV resin microlenses are respectively and selectively a hydrophobic material and hydrophilic material; and the material of the photoresist protection layer and the material of the UV resin microlenses are both transparent materials.

The photoresist protection layer has a thickness that is greater than ⅓ of a height of the micro LEDs.

Each of the vias corresponds to a single one or multiple ones of the micro LEDs so that each of the vias receives a single one or multiple ones of the micro LEDs.

The vias have a shape of rectangle, circle, or ellipse.

The present invention also provides a micro LED array substrate encapsulation method, which comprises the following steps:

Step S1: providing a base plate, wherein the base plate is provided thereon with a micro LED array and forming, through coating, a photoresist layer on the base plate and the micro LED array;

wherein the micro LED array comprises a plurality of micro LEDs arranged in an array;

Step S2: using a mask to subject the photoresist layer to exposure and development so as to form, at locations corresponding to the plurality of micro LEDs, a plurality of vias that are arranged in an array to form a photoresist protection layer, such that the plurality of micro LEDs are respectively located in the plurality of vias; and Step S3: spray-coating UV resin micro-drops into the plurality of vias such that each of the vias receives therein a UV resin material and the UV resin material received in each of the vias has an upper surface in a bulging form, and subjecting the UV resin material received in the plurality of vias to ultraviolet light curing to make the UV resin material received in each of the vias change from a liquid state to a solid state to form a UV resin microlens that has an upper surface in a bulging form in each of the vias, wherein each of the UV resin microlens covers the micro LED located in a corresponding one of the vias.

Step S3 conducts spray-coating of UV resin micro-drops into the plurality of vias by means of a printing head of an ink-jet printing device and the printing head has a diameter that is smaller than a maximum diameter of the vias.

A material the photoresist protection layer and the material of the UV resin microlens are respectively and selectively a hydrophobic material and a hydrophilic material; and the material of the photoresist protection layer and the material of the UV resin microlens are both transparent materials.

The photoresist protection layer has a thickness that is greater than 1/3 of a height of the micro LEDs.

In the plurality of vias formed in Step S2, each of the vias corresponds to a single one or multiple ones of the micro LEDs and each of the vias receives therein a single one or multiple ones of the micro LEDs; and the vias have a shape of rectangle, circle, or ellipse.

The present invention further provides a micro LED array substrate encapsulation structure, which comprises a base plate, a micro LED array arranged on the base plate, and a photoresist protection layer arranged on the base plate;

wherein the micro LED array comprises a plurality of micro LEDs arranged in an array; and the photoresist protection layer is provided, at locations corresponding to the plurality of micro LEDs, with a plurality of vias formed therein and arranged in an array, the plurality of micro LEDs being respectively received in the plurality of vias; and each of the vias is filled therein with a UV resin microlens that has an upper surface made in a bulged form; each of the UV resin microlenses covers the micro LED received in a corresponding one of the vias;

wherein a material of the photoresist protection layer and a material of the UV resin microlenses are respectively and selectively a hydrophobic material and hydrophilic material; and the material of the photoresist protection layer and the material of the UV resin microlenses are both transparent materials; and wherein the photoresist protection layer has a thickness that is greater than 1/3 of a height of the micro LEDs.

The efficacy of the present invention is that the present invention provides a micro light-emitting diode array substrate encapsulation structure, which comprises a base plate, a micro LED array, and a photoresist protection layer. The micro LED array comprises a plurality of micro LEDs arranged in an array. The photoresist protection layer is formed with a plurality of vias at locations corresponding to the plurality of micro LEDs. The plurality of micro LEDs are respectively located in the plurality of vias. Each of the vias is filled therein with a UV resin microlens that has an upper surface in a bulging form and covers the micro LED in the corresponding one of the vias. The micro LEDs and driving substrates located thereunder can be protected and an effect of light emission of the micro LED array substrate can be improved. The present invention provides a micro LED array substrate encapsulation method, which helps protect micro LEDs and driving substrates located thereunder and also improves an effect of light emission of a micro LED array substrate, the method being easy to carry out.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
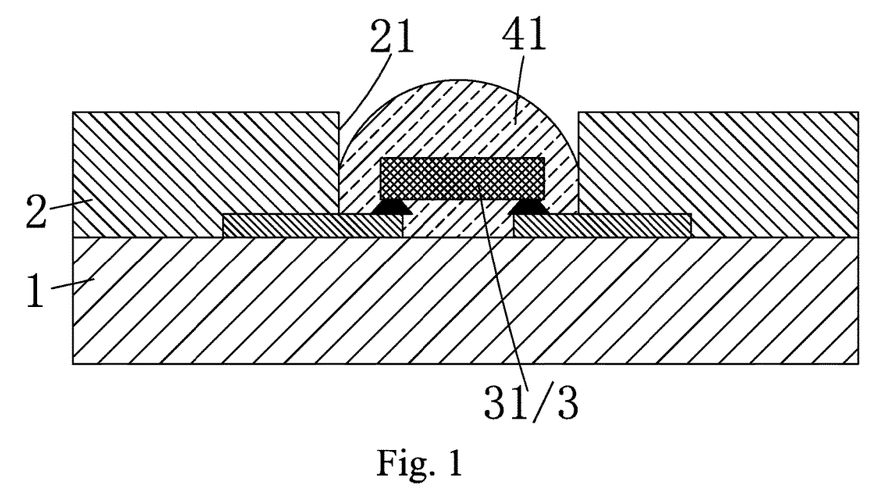
FIG. 1 is a schematic view illustrating a micro light-emitting diode (LED) array substrate encapsulation structure according to the present invention.

Referring to FIG. 1, firstly, the present invention provides a micro light-emitting diode (LED) array substrate encapsulation structure, which comprises a base plate 1, a micro LED array 3 arranged on the base plate 1, and a photoresist protection layer 2 arranged on the base plate 1.

The micro LED array 3 comprises a plurality of micro LEDs 31 arranged in an array. The photoresist protection layer 2 is provided, at locations corresponding to the plurality of micro LEDs 31, with a plurality of vias 21 formed therein and arranged in an array. The plurality of micro LEDs 31 are respectively received in the plurality of vias 21.

Each of the vias 21 is filled therein with an ultraviolet (UV) resin microlens 41 that has an upper surface made in a bulged form. Each of the UV resin microlenses 41 covers the micro LED 31 received in a corresponding one of the vias 21 so that all the UV resin microlenses 41 collectively form a UV resin microlens array.

In the micro LED array substrate encapsulation structure of the present invention, the photoresist protection layer 2 and the UV resin microlenses 41 provided on the base plate 1 collectively provide an effect of protecting the micro LEDs 31 and the base plate 1. Further, the UV resin microlenses 41 provide adjustment of optical paths of light emitting from the micro LEDs 31. Further, the UV resin microlens array allows for pre-design through computer simulation so that a desired distribution of light shape can be obtained through adjustment of a thickness and size of the UV resin microlenses 41 and thus, an effect of light emission of the micro LED array substrate can be improved.

Specifically, a material of the photoresist protection layer 2 and a material of UV resin microlenses 41 are both transparent materials.

Specifically, the material of the photoresist protection layer 2 and the material of the UV resin microlenses 41 are respectively and selectively a hydrophobic material and a hydrophilic material. In other words, the material of the photoresist protection layer 2 and the material of the UV resin microlenses 41 are of opposite properties of water attraction and water repulsion and thus, a repelling force is present between the material of the UV resin microlenses 41 and the photoresist protection layer 2. Further, the UV resin microlenses 41 are formed of a UV resin material, which has low viscosity and high transmission rate, cured and solidified, through UV, in the corresponding ones of the vias 21 so that during the formation of the UV resin microlenses 41, the UV resin material filled in each of the vias 21 is acted upon by the expelling force thereof with respect to a surface of the photoresist protection layer 2 and surface tension thereof to exhibit, on an upper surface thereof, a bulging configuration thereby forming a UV resin microlens 41 of which the upper surface is of a bulging configuration after being curved through UV. For example, when the material of the photoresist protection layer 2 comprises a hydrophobic material and the UV resin material that makes the UV resin microlenses 41 exhibits hydrophilic property, due to the existence of the hydrophobic property of the surface of the photoresist protection layer 2 and the surface tension of the UV resin material, the UV resin material in each of the vias 21 would form an upper surface that is of a bulging configuration so that the UV resin microlens 41 so formed has a bulging upper surface.

Specifically, the photoresist protection layer 2 has a thickness that is greater than ⅓ of a height of the micro LED 31 and this provides the vias 21 formed in the photoresist protection layer 2 with a sufficient depth to allow the UV resin material that forms the UV resin microlenses 41 to be confined in the specific ones of the vias 21 during the formation of the UV resin microlenses 41.

Specifically, the base plate 1 is a thin-film transistor (TFT) array substrate in order to drive the micro LED array 3 arranged thereon so that the micro light-emitting diode array substrate encapsulation structure can be used in fabrication of a micro LED display.

Specifically, each of the vias 21 may correspond to a single one or multiple ones of the micro LEDs 31. In other words, each of the vias 21 may receive and hold a single one or multiple ones of the micro LEDs 31 therein, and this means each of the vias 21 may correspond to one sub-pixel unit or multiple sub-pixel units of a micro LED display, or may correspond to one single pixel unit or multiple pixel units.

Figure 2:
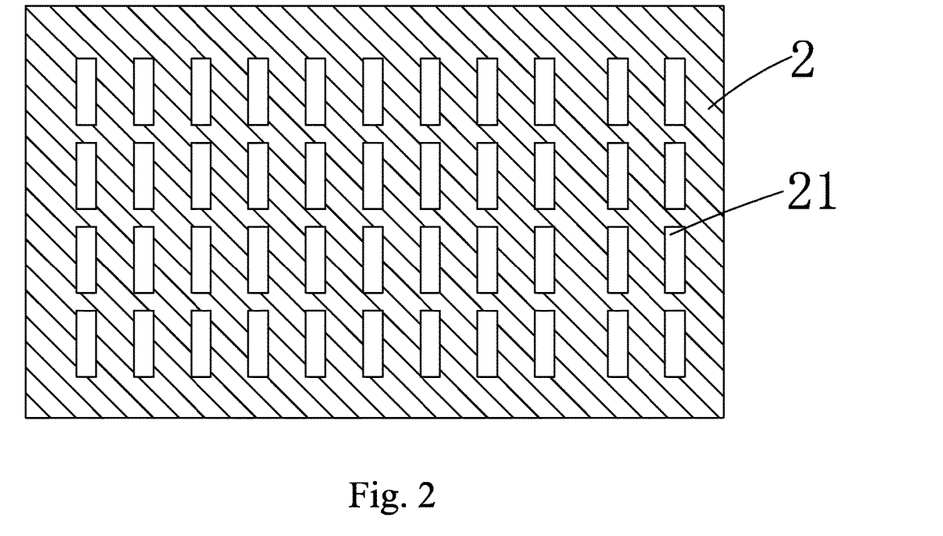
FIG. 2 is a schematic view illustrating an arrangement of vias of a given shape formed in a photoresist protection layer of the micro LED array substrate encapsulation structure according to the present invention.
Figure 3:
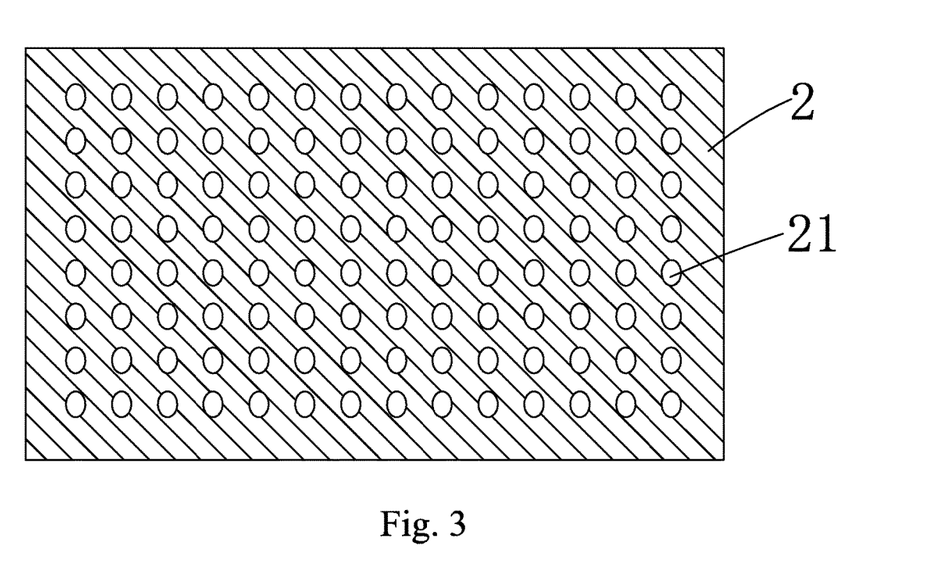
FIG. 3 is a schematic view illustrating an arrangement of vias of another shape formed in the photoresist protection layer of the micro LED array substrate encapsulation structure according to the present invention.

Specifically, the vias 21 may have a shape of rectangle, circle, or ellipse. For example, as shown in FIG. 2, the vias 21 have a shape of rectangle and each of the vias 21 corresponds to a single one or multiple ones of the micro LEDs 31; or alternatively, as shown in FIG. 3, the vias 21 have a shape of circle and each of the vias 21 similarly corresponds to a single one or multiple ones of the micro LEDs 31.

Figure 4:
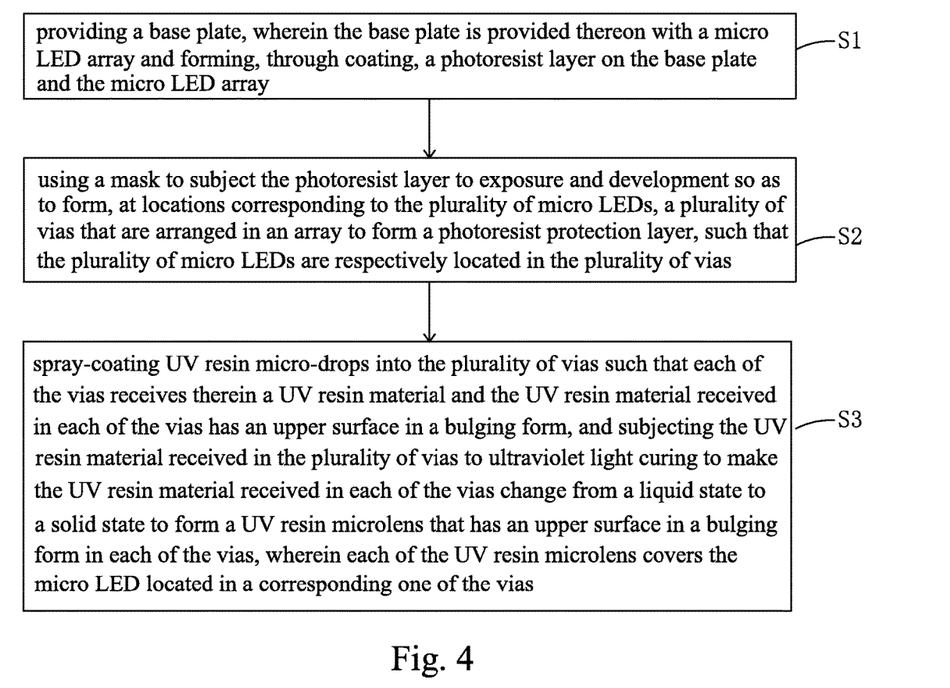
FIG. 4 is a flow chart illustrating a micro LED array substrate encapsulation method according to the present invention.
Figure 5:
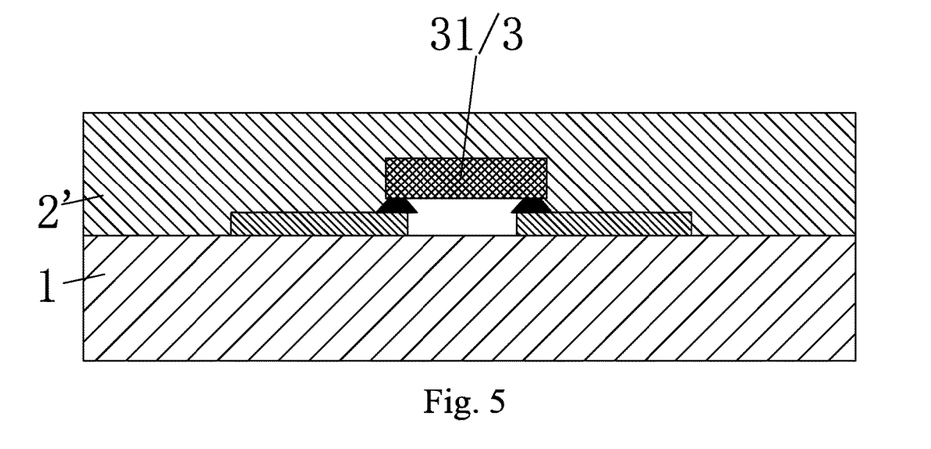
FIG. 5 is a schematic view illustrating Step 1 of the micro LED array substrate encapsulation method according to the present invention.

Referring to FIG. 4, based on the micro light-emitting diode array substrate encapsulation structure described above, the present invention also provides a micro LED array substrate encapsulation method, which comprises the following steps:

Step S1: as shown in FIG. 5, providing a base plate 1, wherein the base plate 1 is provided thereon with a micro LED array 3, and forming, through coating, a layer of transparent photoresist 2' on the base plate 1 and the micro LED array 3.

Specifically, the micro LED array 3 comprises a plurality micro LEDs 31 arranged in an array.

Specifically, the base plate 1 is a TFT array substrate in order to drive the micro LED array 3 arranged thereon so that the micro light-emitting diode array substrate, after being encapsulated, can be used in fabrication of a micro LED display.

Figure 6:
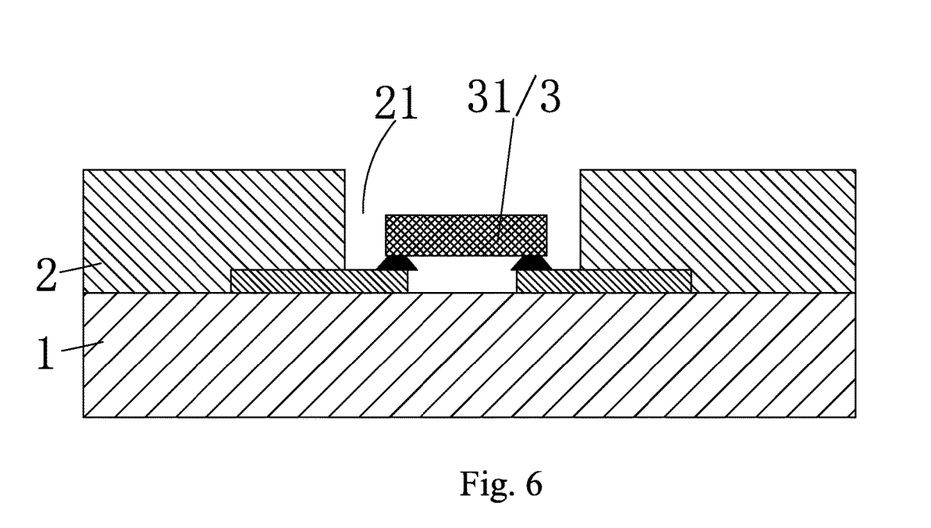
FIG. 6 is a schematic view illustrating Step 2 of the micro LED array substrate encapsulation method according to the present invention.

Step S2: as shown in FIG. 6, using a mask to subject the photoresist layer 2 to exposure and development so as to form, at locations corresponding to the plurality of micro LEDs 31, a plurality of vias 21 that are arranged in an array to form a photoresist protection layer 2, such that the plurality of micro LEDs 31 are respectively located in the plurality of vias 21.

Specifically, Step S2 forms the plurality of vias 21 such that each of the vias 21 corresponds to a single one or multiple ones of the micro LEDs 31. In other words, each of the vias 21 may receive and hold a single one or multiple ones of the micro LEDs 31 therein. The vias 21 have a shape of rectangle, circle, or ellipse.

Step S3: spray-coating UV resin micro-drops into the plurality of vias 21 such that each of the vias 21 receives therein a UV resin material and the UV resin material received in each of the vias 21 has an upper surface in a bulging form, and subjecting the UV resin material received in the plurality of vias 21 to ultraviolet light curing to make the UV resin material received in each of the vias 21 change from a liquid state to a solid state to form a UV resin microlens 41 that has an upper surface in a bulging form in each of the vias 21, wherein each of the UV resin microlens 41 covers the micro LED 31 located in a corresponding one of the vias 21 to thereby form a micro LED array substrate encapsulation structure shown in FIG. 1.

The present invention provides a micro LED array substrate encapsulation method, in which the photoresist protection layer 2 and the UV resin microlenses 41 provided on the base plate 1 collectively provide an effect of protecting the micro LEDs 31 and the base plate 1. Further, the UV resin microlenses 41 provide adjustment of optical paths of light emitting from the micro LEDs 31. Further, the UV resin microlens array allows for pre-design through computer simulation so that a desired distribution of light shape can be obtained through adjustment of a thickness and size of the UV resin microlenses 41 and thus, an effect of light emission of the micro LED array substrate can be improved.

Specifically, Step S3 conducts spray-coating of UV resin micro-drops into the plurality of vias 21 by means of a printing head of an ink-jet printing device and the printing head has a diameter that is smaller than a maximum diameter of the vias 21.

Specifically, in Step S3, the ink-jet printing device uses a continuous ink-jet printing system to conduct spray-coating of the UV resin micro-drops into the plurality of vias 21. The UV resin microlens 41 located in each of the vias 21 may have a thickness that can be adjusted through an amount of UV resin micro-drops sprayed into the corresponding one of the vias 21 and the number of the UV resin micro-drops sprayed into each of the vias 21 can be determined through calculation and analysis conducted in the continuous ink-jet printing system.

Specifically, a material that makes the photoresist protection layer 2 and the material of the UV resin microlenses 41 are respectively a hydrophobic material and a hydrophilic material. In other words, the material of the photoresist protection layer 2 and the UV resin material that makes the UV resin microlenses 41 are of opposite properties of water attraction and water repulsion and thus, a repelling force is present between the UV resin material and the photoresist protection layer 2. Thus, in Step S3, the UV resin material filled in each of the vias 21 is acted upon by the expelling force thereof with respect to a surface of the photoresist protection layer 2 and surface tension thereof to exhibit, on an upper surface thereof, a bulging configuration thereby forming a UV resin microlens 41 of which the upper surface is of a bulging configuration after being curved through ultraviolet light. For example, when the material of the photoresist protection layer 2 comprises a hydrophobic material and the UV resin material that makes the UV resin microlenses 41 exhibits hydrophilic property, due to the existence of the hydrophobic property of the surface of the photoresist protection layer 2 and the surface tension of the UV resin material, the UV resin material in each of the vias 21 would form an upper surface that is of a bulging configuration so that the UV resin microlens 41 so formed has a bulging upper surface.

Specifically, the photoresist layer 2' formed in Step S1 has a thickness that is greater than ⅓ of a height of the micro LEDs 31. In other words, a thickness of the photoresist protection layer 2 formed in Step S2 is greater than ⅓ of the height of the micro LEDs 31, so that the vias 21 of the photoresist protection layer 2 have a sufficient depth to allow the UV resin material that forms the UV resin microlenses 41 to be confined in the specific ones of the vias 21 during the formation of the UV resin microlenses 41.

In summary, the present invention provides a micro light-emitting diode array substrate encapsulation structure, which comprises a base plate, a micro LED array, and a photoresist protection layer. The micro LED array comprises a plurality of micro LEDs arranged in an array. The photoresist protection layer is formed with a plurality of vias at locations corresponding to the plurality of micro LEDs. The plurality of micro LEDs are respectively located in the plurality of vias. Each of the vias is filled therein with a UV resin microlens that has an upper surface in a bulging form and covers the micro LED in the corresponding one of the vias. The micro LEDs and driving substrates located thereunder can be protected and an effect of light emission of the micro LED array substrate can be improved. The present invention provides a micro LED array substrate encapsulation method, which helps protect micro LEDs and driving substrates located thereunder and also improves an effect of light emission of a micro LED array substrate, the method being easy to carry out.

Based on the description given above, those having ordinary skills in the art may easily contemplate various changes and modifications of he technical solution and the technical ideas of the present invention. All these changes and modifications are considered belonging to the protection scope of the present invention as defined in the appended claims.

What is claimed is:

1. A micro light-emitting diode (LED) array substrate encapsulation structure, comprising a base plate, a micro LED array arranged on the base plate, and a photoresist protection layer arranged on the base plate;
    wherein the micro LED array comprises a plurality of micro LEDs arranged in an array; and the photoresist protection layer is provided, at locations corresponding to the plurality of micro LEDs, with a plurality of vias formed therein and arranged in an array, the plurality of micro LEDs being respectively received in the plurality of vias; and
    each of the vias is filled therein with an ultraviolet (UV) resin microlens that has an upper surface made in a bulged form; each of the UV resin microlenses covers the micro LED received in a corresponding one of the vias;
    wherein the photoresist protection layer is made of a photoresist layer that covers the plurality of micro LEDS and is patternable through exposure and development to form the plurality of vias that expose the plurality of micro LEDs, such that the photoresist protection layer and the plurality of the micro LEDs are both located on the base plate with the micro LEDs being separated from each other by the photoresist protection layer.

2. The micro LED array substrate encapsulation structure as claimed in claim 1, wherein a material of the photoresist protection layer and a material of the UV resin microlenses are respectively and selectively a hydrophobic material and hydrophilic material; and
    the material of the photoresist protection layer and the material of the UV resin microlenses are both transparent materials.

3. The micro LED array substrate encapsulation structure as claimed in claim 1, wherein the photoresist protection layer has a thickness that is greater than ⅓ of a height of the micro LEDs.

4. The micro LED array substrate encapsulation structure as claimed in claim 1, wherein each of the vias corresponds to a single one or multiple ones of the micro LEDs so that each of the vias receives a single one or multiple ones of the micro LEDs.

5. The micro LED array substrate encapsulation structure as claimed in claim 1, wherein the vias have a shape of rectangle, circle, or ellipse.

6. A micro light-emitting diode (LED) array substrate encapsulation method, comprising the following steps:
    Step S1: providing a base plate, wherein the base plate is provided thereon with a micro LED array and forming, through coating, a photoresist layer on the base plate and the micro LED array;
    wherein the micro LED array comprises a plurality of micro LEDs arranged in an array;
    Step S2: using a mask to subject the photoresist layer to exposure and development so as to form, at locations corresponding to the plurality of micro LEDs, a plurality of vias that are arranged in an array to form a photoresist protection layer, such that the plurality of micro LEDs are respectively located in the plurality of vias; and
    Step S3: spray-coating ultraviolet (UV) resin micro-drops into the plurality of vias such that each of the vias receives therein a UV resin material and the UV resin material received in each of the vias has an upper surface in a bulging form, and subjecting the UV resin material received in the plurality of vias to ultraviolet light curing to make the UV resin material received in each of the vias change from a liquid state to a solid state to form a UV resin microlens that has an upper surface in a bulging form in each of the vias, wherein each of the UV resin microlens covers the micro LED located in a corresponding one of the vias;
    wherein the photoresist layer is coated on the base plate and the micro LED array such that the photoresist layer covers the plurality of micro LEDS and is patterned through exposure and development to form the plurality of vias at locations corresponding to the plurality of micro LEDS so as to expose the plurality of micro LEDs.

7. The micro LED array substrate encapsulation method as claimed in claim 6, wherein Step S3 conducts spray-coating of UV resin micro-drops into the plurality of vias by means of a printing head of an ink-jet printing device and the printing head has a diameter that is smaller than a maximum diameter of the vias.

8. The micro LED array substrate encapsulation method as claimed in claim 6, wherein a material the photoresist protection layer and the material of the UV resin microlens are respectively and selectively a hydrophobic material and a hydrophilic material; and the material of the photoresist protection layer and the material of the UV resin microlens are both transparent materials.

9. The micro LED array substrate encapsulation method as claimed in claim 6, wherein the photoresist protection layer has a thickness that is greater than ⅓ of a height of the micro LEDs.

10. The micro LED array substrate encapsulation method as claimed in claim 6, wherein in the plurality of vias formed in Step S2, each of the vias corresponds to a single one or multiple ones of the micro LEDs and each of the vias receives therein a single one or multiple ones of the micro LEDs; and the vias have a shape of rectangle, circle, or ellipse.

11. A micro light-emitting diode (LED) array substrate encapsulation structure, comprising a base plate, a micro LED array arranged on the base plate, and a photoresist protection layer arranged on the base plate;

wherein the micro LED array comprises a plurality of micro LEDs arranged in an array; and the photoresist protection layer is provided, at locations corresponding to the plurality of micro LEDs, with a plurality of vias formed therein and arranged in an array, the plurality of micro LEDs being respectively received in the plurality of vias; and each of the vias is filled therein with an ultraviolet (UV) resin microlens that has an upper surface made in a bulged form; each of the UV resin microlenses covers the micro LED received in a corresponding one of the vias;

wherein the photoresist protection layer is made of a photoresist layer that covers the plurality of micro LEDS and is patternable through exposure and development to form the plurality of vias that expose the plurality of micro LEDs, such that the photoresist protection layer and the plurality of the micro LEDs are both located on the base plate with the micro LEDs being separated from each other by the photoresist protection layer;

wherein a material of the photoresist protection layer and a material of the UV resin microlenses are respectively and selectively a hydrophobic material and hydrophilic material; and the material of the photoresist protection layer and the material of the UV resin microlenses are both transparent materials; and wherein the photoresist protection layer has a thickness that is greater than ⅓ of a height of the micro LEDs.

12. The micro LED array substrate encapsulation structure as claimed in claim 11, wherein each of the vias corresponds to a single one or multiple ones of the micro LEDs so that each of the vias receives a single one or multiple ones of the micro LEDs.

13. The micro LED array substrate encapsulation structure as claimed in claim 11, wherein the vias have a shape of rectangle, circle, or ellipse.

* * * * *